United States Patent [19]
Ibok

[11] Patent Number: 6,153,486
[45] Date of Patent: Nov. 28, 2000

[54] METHOD FOR ESTABLISHING SHALLOW JUNCTION IN SEMICONDUCTOR DEVICE TO MINIMIZE JUNCTION CAPACITANCE

[75] Inventor: Effiong Ibok, Sunnyvale, Calif.

[73] Assignee: Advanced Micro Devices, Inc., Sunnyvale, Calif.

[21] Appl. No.: 09/479,504

[22] Filed: Jan. 7, 2000

Related U.S. Application Data

[60] Provisional application No. 60/169,693, Dec. 7, 1999.
[51] Int. Cl.$^7$ ................................................. H01L 21/336
[52] U.S. Cl. ........................ 438/306; 438/301; 438/526; 438/528
[58] Field of Search ................................... 438/301, 306, 438/528, 526

[56] References Cited

U.S. PATENT DOCUMENTS

| | | |
|---|---|---|
| 5,514,902 | 5/1996 | Kawasaki et al. . |
| 5,674,760 | 10/1997 | Hong . |
| 5,908,313 | 6/1999 | Chau et al. . |

*Primary Examiner*—Trung Dang
*Attorney, Agent, or Firm*—LaRiviere, Grubman & Payne, LLP

[57] ABSTRACT

A method for making a semiconductor device including a silicon substrate includes implanting oxide into the substrate after gate stack formation and before source/drain dopant implantation. The oxide is implanted such that it defines a concentration profile peak at about 500 Å from the surface of the substrate. Then, Nitrogen is implanted and annealed as appropriate to cause the Nitrogen to agglomerate along the peak of the oxide concentration. The Nitrogen agglomeration establishes the boundary of shallow junction regions and minimal overlap regions in the substrate. Next, the source/drain dopant is implanted and activated, with the dopant essentially being constrained by the Nitrogen to remain concentrated in the shallow junction and minimal overlap regions, thereby minimizing junction capacitance and overlap capacitance in the finished device and consequently improving the speed of operation of the device.

16 Claims, 2 Drawing Sheets

METHOD FOR ESTABLISHING SHALLOW JUNCTION IN SEMICONDUCTOR DEVICE TO MINIMIZE JUNCTION CAPACITANCE

CROSS-REFERENCE TO RELATED APPLICATION

This application claims the benefit of U.S. Provisional Application No. 60/169,693 filed on Dec. 7, 1999 and entitled "METHOD FOR ESTABLISHING SHALLOW JUNCTION IN SEMICONDUCTOR DEVICE TO MINIMIZE JUNCTION CAPACITANCE".

TECHNICAL FIELD

The present invention relates to the fabrication of semiconductor devices, and more particularly to reducing transistor capacitances in semiconductor devices.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices. Moreover, it is desirable that the devices operate at very fast speeds.

Among the things that can limit the speed with which semiconductor devices operate is extraneous capacitances in the devices. More specifically, undesired electrical capacitance can arise from the portions of the source and drain regions that overlap the gate region, as well as from the source and drain junctions. To minimize this undesired capacitance, the present invention understands that the thickness of the source/drain junctions preferably is minimized.

The present invention further recognizes that the junctions can be made shallow by using very low source/drain dopant implant energies and very low thermal budgets, i.e., by subsequently activating the dopant using as little thermal energy as possible. However, such techniques, while effective, are limited by current manufacturing constraints.

Another way to limit junction depth and, hence, to decrease junction capacitance is to use so-called "silicon on insulator", or "SOI", technology, in which a layer of oxide is buried in the silicon substrate to act as a stop to dopant diffusion (and, hence, to act as a stop to source/drain junction depth). As understood by the present invention, however, current buried oxide layers can typically be disposed in a substrate no closer than about 1000 Å to the surface of the substrate. Thus, source/drain junctions, even in SOI devices, can still be sufficiently deep to cause speed-limiting junction capacitances.

With the above shortcomings in mind, the present invention makes the critical observation that it is possible to limit the depth of the source/drain junctions in semiconductor devices (and, hence, decrease the junction capacitances) using the novel approach set forth herein.

BRIEF SUMMARY OF THE INVENTION

A method for making a semiconductor device including a substrate having a surface includes establishing transistor gate stacks on the substrate such that at least one prospective junction region is defined in the substrate between two adjacent stacks. The method further includes disposing Oxygen in the prospective junction region, with the Oxygen defining a concentration profile having a peak spaced from the surface of the substrate by a predetermined distance, preferably by no more than 500 Å. Also, the method includes disposing Nitrogen into the prospective junction region such that the Nitrogen agglomerates at the peak to define a diffusion boundary. Dopant is then implanted into the prospective junction region, with the Nitrogen impeding the dopant from diffusing past the boundary.

Preferably, the substrate is annealed after disposing the Nitrogen and before implanting the dopant, to establish the boundary. The substrate is likewise annealed after implanting the dopant.

Additionally, in the preferred embodiment described below, a desired minimal overlap region under the gate stacks is determined. The present method contemplates establishing an annealing time and temperature for annealing the substrate with Nitrogen in response to the determining act, such that the Nitrogen diffuses and thereby establishes the minimal overlap regions, whereby overlap capacitance is minimized.

In another aspect, a method for making a semiconductor device includes providing a semiconductor substrate defining a depth dimension, and disposing oxide in the substrate. In accordance with the present invention, the oxide has a concentration profile relative to the depth dimension that defines a peak spaced from the surface by no more than a predetermined distance. The method further includes agglomerating Nitrogen along the peak to establish a boundary of a prospective junction region, and then implanting dopant into the prospective junction region. The boundary inhibits diffusion of the dopant past the boundary.

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
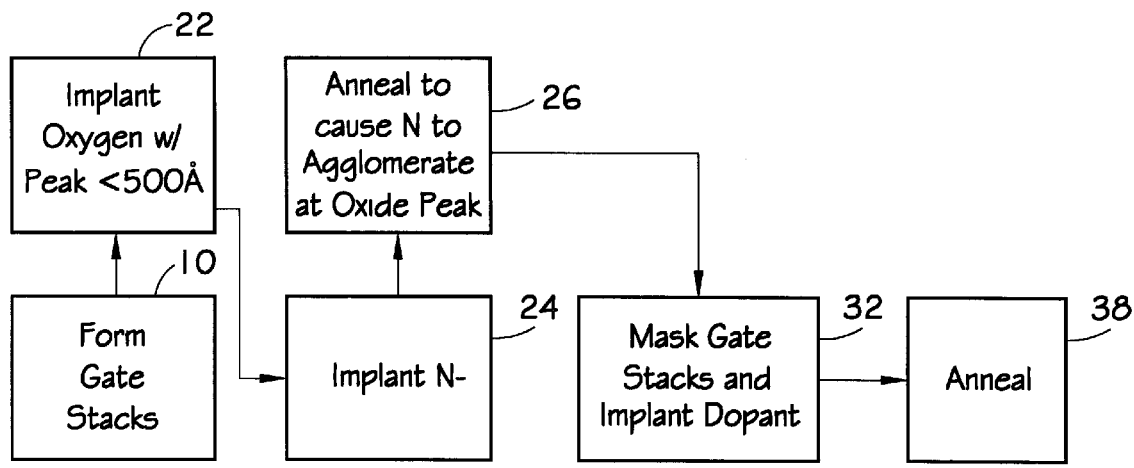
FIG. 1 a flow chart of the present process.

Referring initially to FIG. 1, at block 10 a semiconductor device 12 (FIG. 2) is provided which includes a silicon substrate 14 having plural gate stacks 16 formed thereon in accordance with conventional principles. As is known in the art, a respective gate insulator layer 17 is established between the gate stacks 16 and the substrate 14. In one preferred embodiment, the device 10 is an SOI device. Accordingly, a buried oxide layer 18 is disposed in the substrate 14, with a portion of the substrate 14 below the buried oxide layer 18 establishing a well 20. The principles advanced herein, however, apply equally to bulk CMOS devices.

Figure 2:
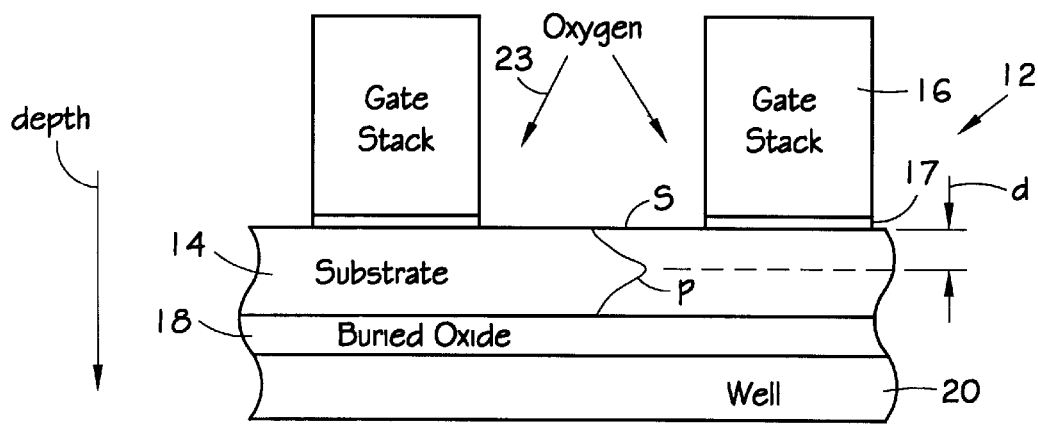
FIG. 2 is a side view of a portion of a semiconductor device made in accordance with the present invention, during oxide implantation, schematically showing the oxide profile.

Moving to block 22 in FIG. 1 and still referring to FIG. 2, oxide is implanted into the substrate 14 as indicated by the arrows 23 using oxidation or Oxygen implantation principles known in the art. The oxide is implanted such that it establishes a concentration profile (relative to the depth dimension "depth" defined the substrate) that has a peak "P" which is spaced from the surface "S" of the substrate 14 by a distance "d" of preferably no more than five hundred Angstroms (500 Å). As shown, the profile of the oxide diminishes from the peak "P" until it merges with the buried oxide layer 18. The oxide can be implanted at an energy of thirty thousand volts (30 KeV) at a dose of up to $10^{16}/cm^2$ and annealed at a temperature up to 1000° C. in a furnace or using rapid thermal annealing (RTA).

Figure 3:
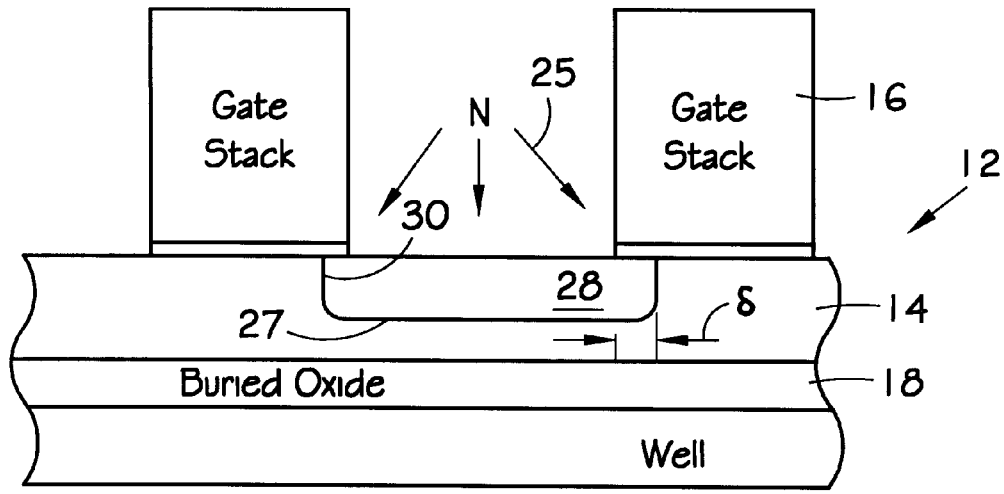
FIG. 3 is a side view of a portion of a semiconductor device made in accordance with the present invention, after Nitrogen implantation and annealing.

Proceeding to block 24 of FIG. 1 and cross-referencing FIG. 3, Nitrogen is implanted into the substrate 14, as indicated by the arrows 25 in FIG. 3, and is then annealed at block 26. The Nitrogen can be implanted using Nitrogen beam techniques. When the Nitrogen is annealed, it agglomerates in the substrate 14 along the peak "P" of the oxide concentration profile to establish a boundary 27 of prospective junction regions 28. Thus, the boundary 27 of the prospective junction regions 28 are spaced the distance "d" from the surface "S" of the substrate 14. The regions 28, as shown in FIG. 3, are defined in the substrate 14 between two adjacent stacks 16. Thus, as intended by the present invention, the implant energy of the Nitrogen and subsequent annealing are established such that the Nitrogen agglomerates along the boundary 27 at the end of the annealing process.

Moreover, the implant energy and/or annealing time and temperature is established after first determining a minimal source/drain overlap with the gate stacks 16. Some amount of junction/gate overlap is necessary for gate coupling, but the overlap should be minimized to minimize overlap capacitance. Accordingly, the Nitrogen implant energy and/ or annealing is established as appropriate such that Nitrogen, after diffusing during annealing, forms a boundary of overlap regions 30. In a preferred embodiment, the distance δ of overlap is no more than 400 Angstroms, and more preferably is no more than 300 Angstroms. The Nitrogen implant energy can be relatively low, e.g., between one thousand electron volts and ten thousand electron volts (1 KeV–10 KeV). The annealing can be undertaken at, e.g., seven hundred fifty degrees Celsius (750° C.) for an hour, or at 1000° C. or below for 30 seconds using rapid thermal annealing.

Figure 4:
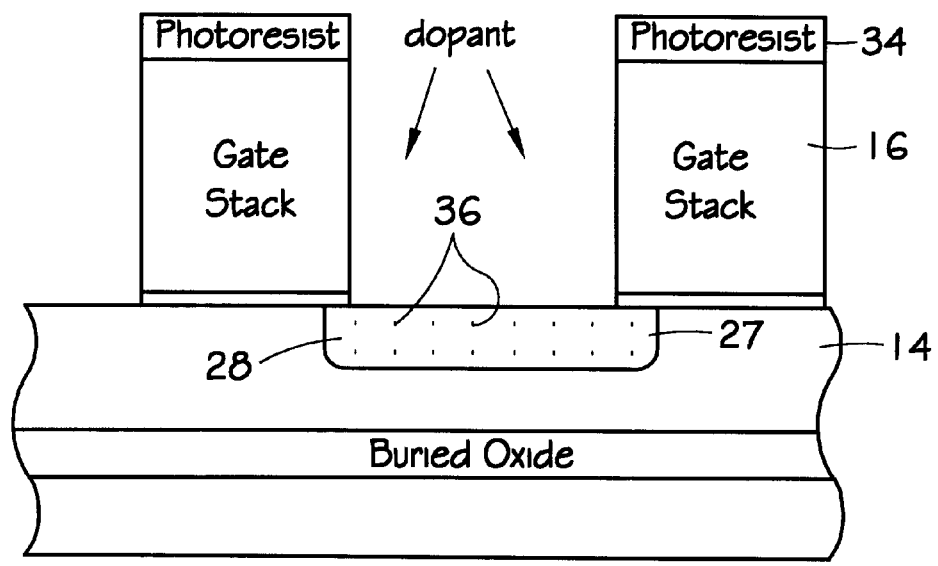
FIG. 4 is a side view of a portion of a semiconductor device made in accordance with the present invention, after source/drain dopant implantation and annealing.

After Nitrogen implant and annealing, at block 32 in FIG. 1 the gate stacks 16 are covered with, e.g., photoresist 34 (FIG. 4), and then source/drain dopant 36 is implanted into the prospective junction regions 28 using conventional dopant implant techniques. Then, at block 38 the substrate with implanted dopant is annealed to activate the dopant. As recognized herein, the Nitrogen stops the dopant at the boundary 27 after annealing, thereby limiting the depth of the junction regions and size of the overlap regions of the device 10 and, hence, the junction and overlap capacitances.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for making a semiconductor device, the semiconductor device including a substrate having a surface, the method comprising:

establishing plural transistor gate stacks on the substrate such that at least one prospective junction region is defined in the substrate between two adjacent stacks;

disposing Oxygen in the prospective junction region, the Oxygen defining a concentration profile having a peak spaced from the surface of the substrate by a predetermined distance;

disposing Nitrogen into the prospective junction region such that the Nitrogen agglomerates at the peak to define a diffusion boundary; and implanting dopant into the prospective junction region, the Nitrogen impeding the dopant from diffusing past the boundary.

2. The method of claim 1, wherein the act of implanting dopant includes implanting the dopant to at least the boundary.

3. The method of claim 1, further comprising annealing the substrate before the act of implanting the dopant, to establish the boundary.

4. The method of claim 1, further comprising annealing the substrate after the act of implanting the dopant.

5. The method of claim 3, further comprising annealing the substrate after the act of implanting the dopant.

6. The method of claim 3, further comprising:

determining a desired minimal overlap region under the gate stacks; and establishing an annealing time and temperature for annealing the substrate with Nitrogen in response to the determining act, such that overlap capacitance is minimized.

7. The method of claim 6, wherein the act of annealing the substrate is established to cause the Nitrogen to diffuse and thereby establish the minimal overlap regions.

8. The method of claim 1, wherein the substrate is an SOI substrate having a buried oxide layer below the boundary and spaced therefrom.

9. The method of claim 1, wherein the predetermined distance is no more than five hundred Angstroms (500 Å).

10. A method for making a semiconductor device, comprising:

providing a semiconductor substrate defining a depth dimension;

disposing oxide in the substrate, the oxide having a concentration profile relative to the depth dimension defining a peak spaced from the surface by no more than a predetermined distance;

agglomerating Nitrogen along the peak to establish a boundary of a prospective junction region; and implanting dopant into the prospective junction region, the boundary inhibiting diffusion of the dopant past the boundary.

11. The method of claim 10, wherein the agglomerating act includes implanting Nitrogen into the substrate and then annealing the substrate before the act of implanting the dopant.

12. The method of claim 11, further comprising annealing the substrate after the act of implanting the dopant.

13. The method of claim 11, further comprising:

determining a desired minimal overlap region under the gate stacks; and establishing an annealing time and temperature for annealing the substrate with Nitrogen in response to the determining act, such that overlap capacitance is minimized.

14. The method of claim 13, wherein the act of annealing the substrate after Nitrogen disposition is established to cause the Nitrogen to diffuse and thereby establish the minimal overlap regions.

15. The method of claim 10, wherein the substrate is an SOI substrate having a buried oxide layer.

16. The method of claim 10, wherein the predetermined distance is no more than five hundred Angstroms (500 Å).

* * * * *